United States Patent
Kim

(10) Patent No.: US 6,536,002 B1
(45) Date of Patent: Mar. 18, 2003

(54) BUFFERED REDUNDANCY CIRCUITS FOR INTEGRATED CIRCUIT MEMORY DEVICES

(75) Inventor: Nam-jong Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/471,798

(22) Filed: Dec. 23, 1999

(30) Foreign Application Priority Data

Jan. 13, 1999 (KR) ................................................ 99-726

(51) Int. Cl.[7] ................................................ G11C 29/00
(52) U.S. Cl. ................................................ 714/710; 714/711
(58) Field of Search .............................. 365/201, 200; 714/30, 718, 733, 924, 711, 710; 326/41

(56) References Cited

U.S. PATENT DOCUMENTS

| | | | | |
|---|---|---|---|---|
| 5,325,334 A | | 6/1994 | Roh et al. ................... | 365/201 |
| 5,640,354 A | * | 6/1997 | Jang et al. ................... | 365/201 |
| 5,742,547 A | | 4/1998 | Lee .............................. | 365/200 |
| 5,748,543 A | * | 5/1998 | Lee et al. .................... | 365/200 |
| 5,761,138 A | | 6/1998 | Lee et al. .................... | 365/200 |
| 5,777,931 A | | 7/1998 | Kwon et al. ................. | 365/200 |
| 5,818,772 A | * | 10/1998 | Kuge ........................... | 365/201 |
| 5,923,599 A | * | 7/1999 | Hii et al. ..................... | 365/201 |
| 6,108,798 A | * | 8/2000 | Heidel et al. ................ | 714/30 |
| 6,169,418 B1 | * | 1/2001 | Wagner ....................... | 326/41 |
| 6,230,290 B1 | * | 5/2001 | Heidel et al. ............... | 714/718 |

* cited by examiner

*Primary Examiner*—David Ton
(74) *Attorney, Agent, or Firm*—Myers Bigel Sibley & Sajovec

(57) ABSTRACT

Integrated circuit memory device redundancy circuits are provided that include a plurality of transistors and fuses, a respective transistor and a respective fuse being serially coupled between a respective address line input and a logic circuit to generate a selection signal for a redundant memory cell in response to a predetermined address on the address bus of the integrated circuit memory device. In one embodiment, a decoder is coupled between the address bus of the integrated circuit memory device and a plurality of external address inputs of the integrated circuit memory device. A redundancy enable control circuit may be provided that includes a main fuse and that generates a fuse enable signal in response to opening of the main fuse wherein the plurality of transistors are responsive to the fuse enable signal.

13 Claims, 2 Drawing Sheets

ବୁଏFERED REDUNDANCY CIRCUITS FOR
INTEGRATED CIRCUIT MEMORY DEVICES

FIELD OF THE INVENTION

This invention relates to integrated circuit memory devices and more particularly to redundancy circuits for integrated circuit memory devices.

BACKGROUND OF THE INVENTION

One of the major determinants of the cost of producing memory chips is wafer yield, which may be defined as the ratio of non-defective chips to total chips fabricated on a given wafer. In general, the higher the integration density of the memory chip, the higher the probability that one or more memory cells thereof will be defective. Thus, the higher the integration density of the chips fabricated on a given wafer, the lower the wafer yield as a result of defective memory cells. Accordingly, the need for devices which correct defects in order to enhance wafer yield may be more acute with the advent of high-density memory chips. One way to correct memory cell defects in order to enhance wafer yield is the provision of a redundant memory circuit which includes one or more redundant rows and/or columns of memory cells that may be used to replace rows and/or columns of the main memory array which are found to be defective, for example, during testing, wafer sort, or other processes. In general, the redundant rows and/or columns have unspecified addresses and redundant decoders coupled thereto. The redundant decoders can be programmed to match the addresses of rows and/or columns which are determined to be defective. The defective rows and/or columns may further be decoupled or disabled.

In operation, when a memory read or write cycle is executed, the redundant decoders are responsive to the addresses of the disabled defective rows and/or columns, thereby effectively replacing the defective rows and/or columns with the redundant rows and/or columns. This technique of replacing defective rows and/or columns with redundant rows and/or columns is oftentimes referred to as repairing defective memory cells.

A typical programmable redundant decoder includes polysilicon fusible links, i.e., fuses, connected to respective address bit lines of a row address or column address buffer, depending upon whether the redundant decoder is a redundant row or column decoder, respectively. In order to program such a redundant decoder with the address of a column or row of memory cells having a defective memory cell, selected ones of the fuses are cut/blown, e.g., by means of a laser.

One approach to replacing a defective column and/or row address with a redundant column and/or row address is described in U.S. Pat. No. 5,325,334 ("the '334 patent") which is incorporated herein by reference. As described in the '334, patent a plurality of fuses within a fuse box array are programmed so as to be selectively cut or burnt to select a redundant memory cell (column) responsive to an address of a defective cell (column). When a column address signal corresponding to a defective column is input to the fuse box array, a redundant column is activated. The activated redundant column replaces the defective column. A plurality of fuse boxes are arranged in the fuse box array to allow repair of a plurality of defective columns. Each of the fuse boxes shares a column address signal input, and includes a plurality of fuses for use in programming a column address corresponding to a defective column. When a defective column address is input to a fuse box, a redundant column driver gate is driven in response to a first output signal provided by a block selection control circuit to select a predetermined redundant column.

However, in the circuit discussed in the '334 patent, use or non-use of a plurality of fuse boxes arranged to repair defective columns is determined by the number of generated defective columns. Therefore, different loads can be applied respectively to lines of a column address signal bus depending on whether the fuses are open or closed. The difference in load between the column address signal lines may cause skew between column address signals. Such skew may lower the transmission speed of the column address signals.

Additional redundancy systems are described, for example, in U.S. Pat. No. 5,742,547 to Lee, entitled "Circuits for Block Redundancy Repair of integrated Circuit Memory Devices; " U.S. Pat. No. 5,761,138 to Lee et al., entitled "Memory Devices Having A Flexible Redundant Block Architecture" and U.S. Pat. No. 5,777,931 to Kwon et al., entitled "Synchronized Redundancy Decoding Systems and Methods for Integrated Circuit Memory Devices, " (which provides redundancy circuits without transfer gates) the disclosures of all of which are hereby incorporated herein by reference.

SUMMARY OF THE INVENTION

The present invention provides integrated circuit memory device redundancy circuits that include a plurality of transistors and fuses, a respective transistor and a respective fuse being serially coupled between a respective address line input and a logic circuit to generate a selection signal for a redundant memory cell in response to a predetermined address on the address line inputs. A buffer circuit is coupled between the address line inputs and an address bus of the integrated circuit memory device. In one embodiment, a decoder is coupled between the address bus of the integrated circuit memory device and a plurality of external address inputs of the integrated circuit memory device. A redundancy enable control circuit may be provided that includes a main fuse and that generates a fuse enable signal in response to opening of the main fuse wherein the plurality of transistors are responsive to the fuse enable signal. The fuse enable signal may be generated in response to a power up signal. More particularly, the fuse enable signal may be generated for an initial period responsive to the power up signal when the main fuse is open and when the main fuse is closed and generated for a second period following the initial period only when the main fuse is open.

In one embodiment, the transistors are MOS transistors and the gates of the MOS transistors are coupled to the fuse enable signal. More particularly, the MOS transistors may be NMOS transistors each having a source coupled to one of the address line inputs and a drain coupled to one of the fuses. The redundancy circuit may also include a plurality of PMOS transistors each having a gate coupled to the fuse enable signal, a source coupled to a first reference voltage and a drain coupled to one of the fuses. The redundancy enable control circuit in one embodiment includes a PMOS transistor having a gate coupled to the power up signal and a source connected to a first reference voltage and an NMOS transistor having a gate coupled to the power up signal and a source connected to a second reference voltage. The main fuse may be coupled between the drains of the PMOS transistor and the NMOS transistor. The redundancy enable control circuit may also include a latch that latches the fuse enable signal.

In another embodiment of the present invention, the redundancy circuit includes a main memory block having a plurality of cells. The main fuse is associated with one of the plurality of cells. The main memory block is coupled to and addressed by the address bus of the integrated circuit memory device. The redundancy circuit further includes a redundancy memory cell block including the redundant memory cell. The redundant memory cell is selected responsive to the selection signal. The redundancy memory cell block preferably includes a plurality of redundant memory cells each having an associated plurality of transistors and fuses, a respective transistor and a respective fuse being serially coupled between a respective address line input and a logic circuit to generate a selection signal for the associated one of the redundant memory cells in response to a predetermined address on the address line inputs. An associated buffer circuit may be coupled between the corresponding address line inputs and the address bus of the integrated circuit memory device. An associated redundancy enable control circuit may include a main fuse and generate a fuse enable signal in response to opening of the main fuse wherein the plurality of transistors are responsive to the fuse enable signal. Each of the main fuses may be associated with one of the plurality of cells of the main memory block.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1:
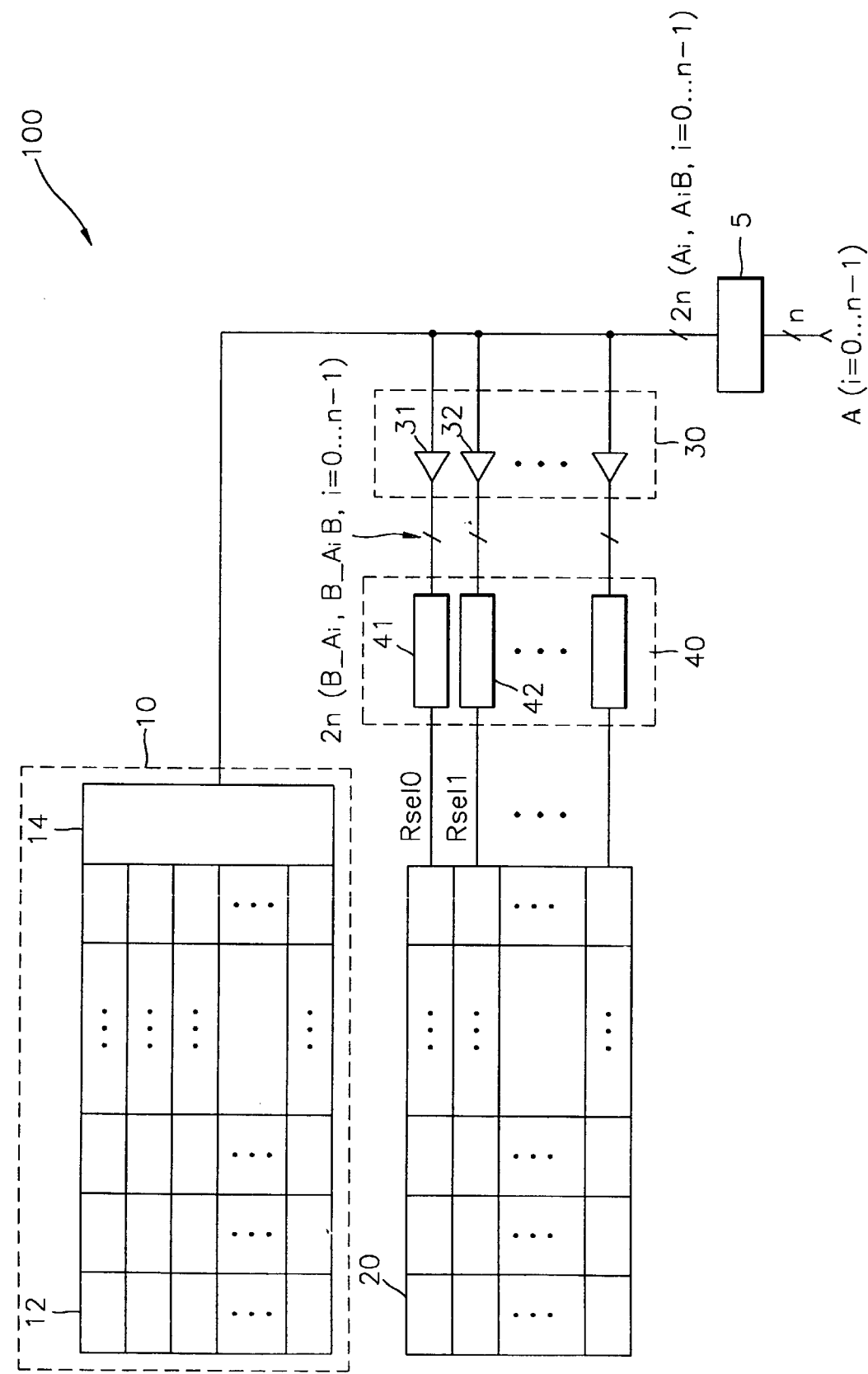
FIG. 1 is a block diagram illustrating a redundancy circuit in an integrated circuit memory device according to an embodiment of the present invention.

FIG. 1. is a block diagram of redundancy circuits according to the present invention. A redundancy circuit according to the present invention can operate in an integrated circuit memory device having normal memory cells for storing data and redundant memory cells for repairing defective cells in the normal memory cells. Integrated circuit memory devices that replace defective memory cells with redundant memory cells are well known to those having skill in the art and need not be described further herein.

Referring to FIG. 1, a semiconductor (integrated circuit) memory device 100 includes a predecoder 5, a main memory block 10, a redundancy memory block 20, a buffer circuit 30, and a plurality of fuse blocks 40. The plurality of fuse blocks 40 includes individual fuse blocks 41, 42 etc. The buffer circuit 30 includes buffers 31, 32 etc. which may be understood by those skilled in the art.

The predecoder 5 decodes n-bit external addresses $A_i$ (i=0 . . . n−1) input to the semiconductor memory device 100, and generates decoded addresses $A_i$ and $A_iB$ (i=0 . . . n−1). The predecoded addresses $A_i$ and $A_iB$ (i=0 . . . n−1) drive a decoder 14 in the main memory block 10, and are also coupled to the buffer circuit 30. As shown in FIG. 1, each address line is coupled to one of the buffers 31, 32, etc.

The main memory block 10 includes a main memory cell block 12 having a plurality of memory cells which may be arranged in rows and columns as well as the decoder 14 which decodes the predecoded addresses $A_i$ and $A_iB$. The rows and/or columns of the main memory cell block 12 are selected by the output signal of the decoder 14. The selected rows and/or columns thereby select a memory cell inside the main memory cell block 12.

When, for example, during a circuit test, a selected memory cell within the main memory cell block 12 is identified as defective, a row and/or a column associated with the defective cell is designated as a defective row and/or column. For example, a meltable fuse within the decoder 14 connected to the defective row and/or column can be blown (opened) to select replacements of the defective cell with a redundancy memory cell. The original addressing path connected to the defective cell within the main memory cell block 12 via the decoder 14 may thereby be blocked, so the defective cell will no longer be selected.

The redundancy memory block 20 includes a plurality of redundancy cells which may be arranged in rows and columns. The rows and/or columns within the redundancy memory block 20 are selected in response to the activation of redundancy selection signals Rsel0, Rsel1, etc. generated by the plurality of fuse blocks 40. The selected rows and/or columns within the redundancy memory block 20 are used to replace defective rows and/or columns of the main memory cell block 12.

As noted above, the buffer circuit 30 includes a plurality of buffers 31, 32, etc. The buffers 31, 32, etc. are coupled to an address bus of the memory device 100 to input the predecoded addresses $A_i$ and $A_iB$. The buffers 31, 32, etc., output buffered signals $B\_A_i$ and $B\_A_iB$ (i=0 . . . n−1) corresponding to the predecoded addresses. The output signals $B\_A_i$ and $B\_A_iB$ of the buffers 31, 32, etc. are provided to associated ones of the fuse blocks 41, 42, etc. in the plurality of fuse blocks 40. The fuse blocks 41, 42, etc. are selected by the output signals $B\_A_i$ and $B\_A_iB$ from the buffers 31, 32, etc. to generate the redundancy selection signals Rsel0, Rsel1, etc. for selecting the redundancy rows and/or columns within the redundancy memory block 20.

Figure 2:
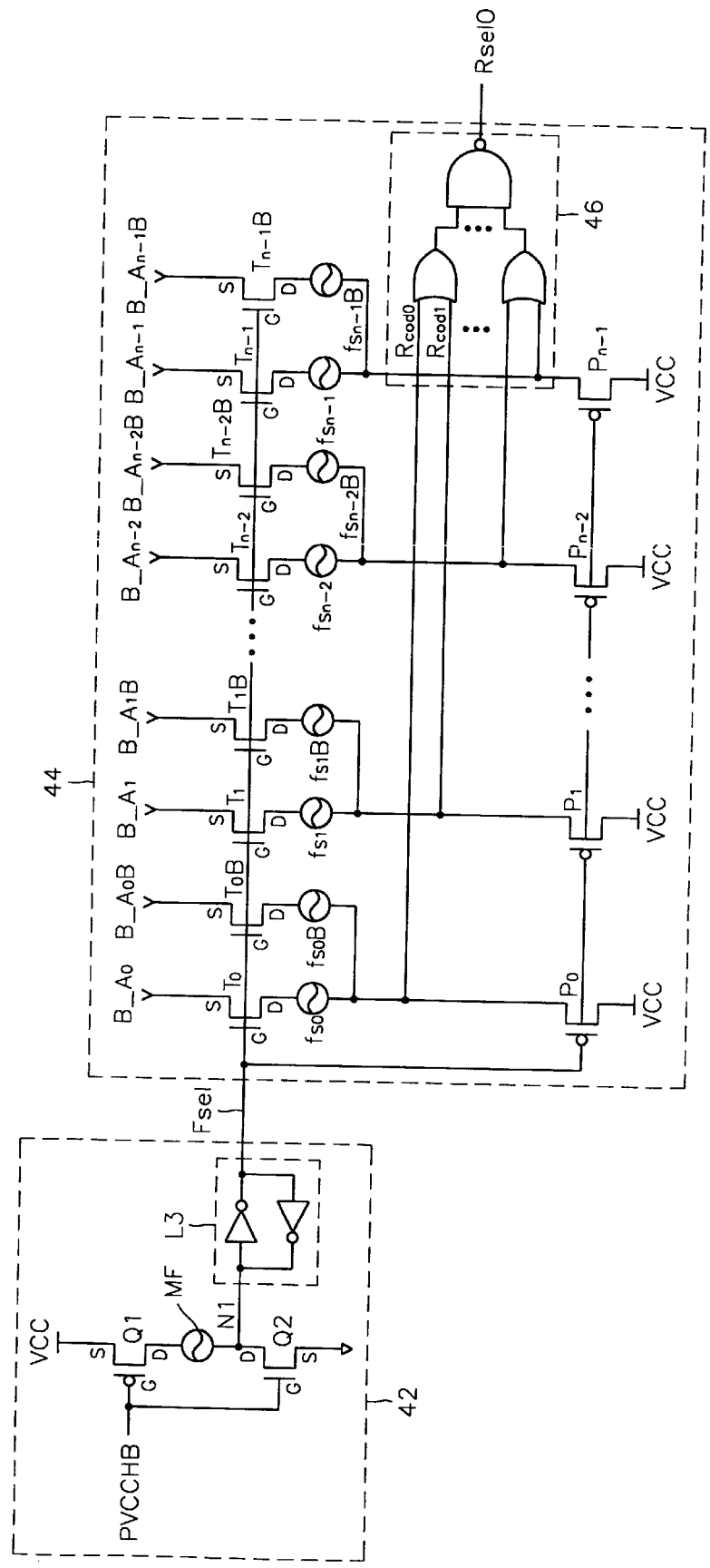
FIG. 2 is a circuit diagram illustrating an embodiment of a redundancy enable circuit shown in FIG. 1.

FIG. 2 is a circuit diagram illustrating an embodiment of the fuse block 41 of FIG. 1. As shown in FIG. 2, the fuse block 41 includes a redundancy enable control circuit 42 and a redundancy driver circuit 44. The redundancy enable control circuit 42 activates a fuse enable signal Fsel to a logic "high" level in response to the activation of a power-up signal PVCCHB when the main fuse MF is cut (open). As shown in FIG. 2, the redundancy enable control circuit 42 includes a PMOS transistor Q1 having a gate G to which the power-up signal PVCCHB is applied and a source S to which a first reference voltage, such as a power supply voltage Vcc is applied. An NMOS transistor Q2 is also included having a gate G to which the power-up signal PVCCHB is connected and a source S to which a second voltage reference (a ground voltage in FIG. 2) is connected. The main fuse MF is coupled between the drain D of the PMOS transistor Q1 and the drain D of the NMOS transistor Q2. A node N1 coupled to the drain D of the NMOS transistor Q2 and to one end of the main fuse MF provides the fuse enable signal Fsel through a latch circuit L3.

During start-up, when the power supply voltage Vcc is applied, the power-up signal PVCCHB is at a logic "high"

level corresponding to the level of the applied power supply voltage. However, PVCCHB is deactivated to a logic "low" level when the power supply voltage Vcc reaches a predetermined voltage level. When the power-up signal PVCCHB is at a logic "high" level, the NMOS transistor Q2 is turned on and the node Ni is thus initialized to a logic "low" level corresponding to the ground voltage. Thus, the fuse enable signal Fsel is activated to a logic "high" level by the latch circuit L3. Thereafter, when the power-up signal PVCCHB becomes a logic "low" level, the PMOS transistor Qi is turned on and the node N1 becomes a logic "high" level. Thus, the fuse enable signal Fsel is deactivated to a logic "low" level by the latch L3. The low level fuse enable signal Fsel prevents a selection of memory cells in the redundancy memory block 20 by controlling the redundancy driver circuit 44.

To enable substitution of memory from redundancy memory block 20, the main fuse MF is blown for the corresponding defective portion of main memory block 10. Thus, the node N1 is separated from the power supply voltage Vcc. When the power-up signal PVCCHB is activated to a logic "high" level, while the power supply voltage Vcc is applied, the node N1 is initialized to a logic "low" level. Thereafter, when the power-up signal PVCCHB is deactivated to a logic "low" level, the NMOS transistor Q2 is turned off and the PMOS transistor Q1 is turned on. However, the power supply voltage Vcc is no longer supplied to the node N1 by the main fuse MF which was blown (opened). Therefore, the node N1 maintains an initial logic "low" level which is inverted and latched by the latch L3, to set the fuse enable signal Fsel to a latched logic "high" level.

Association of a memory cell of the redundancy memory block 20 with a specific address is provided by a plurality of substitutive (i e. for selecting a redundant memory cell to replace a main memory cell by address) fuses fsi, fsiB (i=0 . . . n−1) in the redundancy driver circuit 44 which are selectively blown (opened) to select an address corresponding to defective rows and/or columns of the main memory block 10. The redundancy driver circuit 44 is enabled by the fuse enable signal Fsel. The redundancy driver circuit 44 receives as address input lines the output signals of the buffer circuit 30 which are coupled through the substitutive fuses fsi, FsiB to the select circuit 46 which generates a redundancy selection signal Rsel0.

As illustrated in the embodiment of FIG. 2, the redundancy driver circuit 44 includes 2n NMOS transistors $T_i$, $T_iB$ (i=0 . . . n−1) having gates G to which the fuse enable signal Fsel is coupled and sources S to which the output signals of the buffer circuit 30 are coupled. In addition, n PMOS transistors $P_i$ (i=0 . . . n−1) having gates G to which the fuse enable signal Fsel is connected and sources S to which the power supply voltage is coupled are also provided. The 2n substitutive fuses fsi, fsiB are coupled between the drain D of each of the NMOS transistors $T_i$, $T_iB$ and the drain D of each of the PMOS transistors $P_i$. For example, the drains of the NMOS transistors $T_o$, $T_oB$ are connected to the drain of the PMOS transistor $P_o$ via substitutive fuses fs0, fs0B. These transistors have sources to which a pair of decoding addresses $B\_A_o$, $B\_A_oB$ from the buffer circuit 30 of FIG. 1 are connected.

When the fuse enable signal Fsel is activated to a logic "high" level, the PMOS transistors $P_i$ are turned off and the NMOS transistors $T_i$, $T_iB$ are turned on so that the output signals of the buffer circuit 30 of FIG. 1 are provided to the substitutive fuses fsi, fsiB. The substitutive fuses fsi, fsiB corresponding to the output signals $B\_A_i$, $B\_A_iB$ of a logic "high" level may be coded (selected) in a blown state. The logic "high" level signals among the output signals $B\_A_i$, $B\_A_iB$ of the buffer circuit 30 are then not transmitted because of the coded state of the fuse, but low level output signals are transmitted as redundancy coding signals Rcodi. Therefore, all the redundancy coding signals Rcodi may be set to a logic "low" level and the redundancy selection signal Rsel0 may thereby be set to a logic "high" level so that corresponding redundancy rows and/or columns of the redundancy memory block 20 are selected.

When the power-up signal PVCCHB is deactivated to a logic "low" level and the main fuse MF in the redundancy enable circuit 42 is not blown, the fuse enable signal Fsel is deactivated to a logic "low" level. Thus, the n PMOS transistors $P_i$ are turned on, and the NMOS transistors $T_i$, $T_iB$ are turned off, so that the redundancy coding signals $Rcod_i$ may be set to a logic "high" level regardless of the state of the substitutive fuses fsi, fsiB. The redundancy selection signal Rsel0 is thereby set to a logic "low" level so that the corresponding redundancy rows and/or columns are not selected.

For the embodiment of FIG. 2, when the redundancy selection signal Rsel0 is set to a logic "low" level, redundancy rows and/or columns are not selected. When a defective cell is found in the main memory cell block 12, the redundancy driver circuit 44 is configured so that a redundancy selection signal Rsel0 becomes a logic "high" level when a corresponding address is on the address bus of the memory device 100, so that the redundancy rows and/or columns are selected.

As described above, the present invention provides a redundancy circuit which includes the buffer circuit 30. As a result, the loads on address input lines and gates of the redundancy driver circuit 44 may be buffered from the address bus of the memory device 100 carrying the address from decoder 5. Thus, the loads on the addresses bus may be more constant regardless of which substitutive fuses are blown. A reduction in the transmission speed of the address bus may then be less likely to result from skew between the individual address lines.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A redundancy circuit for an integrated circuit memory device, comprising:
    a plurality of transistors and fuses, a respective transistor and a respective fuse being serially coupled between a respective address line input and a logic circuit to generate a selection signal for a redundant memory cell in response to a predetermined address on the address line inputs; and
    a buffer circuit coupled between the address line inputs and an address bus of the integrated circuit memory device.

2. The redundancy circuit of claim 1 further comprising a decoder coupled between the address bus of the integrated circuit memory device and a plurality of external address inputs of the integrated circuit memory device.

3. The redundancy circuit of claim 1 further comprising a redundancy enable control circuit that includes a main fuse and that generates a fuse enable signal in response to opening of the main fuse wherein the plurality of transistors are responsive to the fuse enable signal.

4. The redundancy circuit of claim 3 wherein the redundancy enable control circuit generates the fuse enable signal in response to a power up signal.

5. The redundancy circuit of claim 4 wherein the redundancy enable control circuit generates the fuse enable signal for an initial period responsive to the power up signal when the main fuse is open and when the main fuse is closed and generates the fuse enable signal for a second period following the initial period only when the main fuse is open.

6. The redundancy circuit of claim 5 wherein the transistors are MOS transistors, the gates of the MOS transistors being coupled to the fuse enable signal.

7. The redundancy circuit of claim 6 wherein the MOS transistors are NMOS transistors each having a source coupled to one of the address line inputs and a drain coupled to one of the fuses, the redundancy circuit further comprising a plurality of PMOS transistors each having a source coupled to a first reference voltage and a drain coupled to one of the fuses.

8. The redundancy circuit of claim 5 wherein the redundancy enable control circuit comprises:
   a PMOS transistor having a gate coupled to the power up signal and a source connected to a first reference voltage;
   an NMOS transistor having a gate coupled to the power up signal and a source connected to a second reference voltage; and
   wherein the main fuse is coupled between the drains of the PMOS transistor and the NMOS transistor.

9. The redundancy circuit of claim 8 wherein the redundancy enable control circuit further comprises a latch that latches the fuse enable signal.

10. A redundancy circuit in a semiconductor memory device including a main memory block having a plurality of memory cells arranged in row sand columns, and a plurality of redundancy memory cell blocks for repairing defective cells which can be possibly generated in the main memory block, the circuit comprising:
    a plurality of redundancy enable circuits for selecting the memory cells of the corresponding redundancy memory cell block to replace the defective cells of the main memory block by a predetermined repair operation;
    a plurality of buffer circuits driven by predetermined addresses, for providing output signals to the corresponding redundancy enable circuits;
    wherein the redundancy enable circuits comprise;
        a redundancy enable control circuit having a main fuse for generating a fuse enable signal, the fuse enable signal activated when the main fuse is blown; and
        a redundancy driver circuit enabled by the fuse enable signal for generating a redundancy selection signal, the redundancy selection signal activated when the addresses are received by coded substitutive fuses.

11. The redundancy circuit as claimed in claim 10, wherein the logic state of the fuse enable signal during the initial power-up period is the same as the state during the latter power-up period when the main fuse is blown, and the logic state of the fuse enable signal during the initial power-up period is not the same as the state during the latter power-up period when the main fuse is not blown.

12. The redundancy circuit as claimed in claim 10, wherein the redundancy enable control circuit comprises:
    a PMOS transistor having a gate connected to a power up signal, and a source connected to a power supply voltage;
    an NMOS transistor having a gate connected to the power up signal, and a source connected to a ground voltage;
    the main fuse interposed between the drains of the PMOS and NMOS transistors; and
    a latch unit connected to the drain of the NMOS transistor and one end of the main fuse for latching a fuse enable signal.

13. The redundancy circuit as claimed in claim 10, wherein the redundancy driver circuit comprises:
    a plurality of NMOS transistors having gates each connected to the fuse enable signal, and sources each connected to the addresses respectively;
    a plurality of PMOS transistors having gates each connected to the fuse enable signal, and sources each connected to the ground voltage; and
    a plurality of fuses each interposed between the drain of each of the NMOS transistors connected to one address among the addresses and the drain of each of the PMOS transistors.

* * * * *